MULTIVIBRATOR CIRCUITS USING SNAP ACTION DIODES AS CONTROL ELEMENTS

Filed Sept. 17, 1965 2 Sheets-Sheet 1

INVENTOR

John G. Fields,

BY R. P. Miller

ATTORNEY

United States Patent Office 3,363,114

Patented Jan. 9, 1968

3,363,114

MULTIVIBRATOR CIRCUITS USING SNAP ACTION DIODES AS CONTROL ELEMENTS

John G. Fields, Burlington, N.C., assignor to Western Electric Company, Incorporated, New York, N.Y., a corporation of New York Filed Sept. 17, 1965, Ser. No. 488,201
9 Claims. (Cl. 307—274)

This invention relates to PNPN diode multivibrator circuits and more particularly to circuits for monostable and astable multivibrators using timing circuits in conjunction with conventional diodes to operate bistable PNPN switching diodes.

Multivibrator circuits using PNPN diodes are known in the art. However, the prior art circuits generally utilize a transistor current valve to control the switching of the PNPN diodes. In addition to adding to the cost and complexity of the circuitry, the use of transistors renders the multivibrators sensitive to changes in temperature. Further, the output waves of other prior art PNPN diode multivibrators are not true square-waves, but are generally sawtooth in shape.

Accordingly, it is an object of this invention to provide new and improved monostable and astable multivibrators using timing circuits in conjunction with conventional diodes to operate PNPN switching diodes.

It is a further object of this invention to provide new and improved monostable and astable multivibrators which are substantially free from temperature variations.

Another object of this invention is to provide a square and sawtooth output multivibrator employing a bistable two-terminal PNPN semiconductor device in conjunction with control facilities which apply an initiating bias at a substantially high level whereafter the device maintains operation with a bias at a substantially low level which is overcome by application of a negative short duration trigger pulse.

Yet another object of the invention resides in a wide range pulse generator having a control circuit for a PNPN diode which in one instance is switched to apply a relatively high biasing voltage to initiate conduction of the diode and which in a second instance is switched to produce a relatively low sustaining voltage to place the diode in a non-conducting state whereafter the control circuit again operates the diode.

Another object of this invention is to provide a free-running astable multivibrator employing two-terminal semiconductor devices controlled by series combinations of conventional diodes and PNPN diodes and which generates two continuous series of phase-inverted output pulses of substantially square wave characteristics.

In accordance with one embodiment of the invention, there is provided a monostable multivibrator comprising a PNPN diode biased by a voltage divider to a point just below the high conduction state. A normally operated control circuit increases the bias on the diode so that it switches to the high conduction state, where it remains until a momentary trigger pulse from an external source operates the control circuit to remove the additional bias needed to maintain the PNPN diode in the high conduction state. The diode then switches back to the low conduction state and a capacitor, previously discharged by the conducting diode, now accumulates charge through a timing resistor to reoperate the control circuit and reswitch the PNPN diode to the high conduction state.

In another embodiment of the invention, two multivibrators in accordance with the first embodiment of the invention, are coupled together to form a two-stage, free-running, astable multivibrator in which the operation of the first stage provides the necessary momentary trigger pulse to operate the second stage and vice-versa. This is accomplished by the use of two-timing resistors individually associated with the respective stages and a common capacitor.

These and other objects of the invention will become clearly apparent from the following description when taken in conjunction with the accompanying drawings in which.

The circuits of the present invention accomplish the aforementioned objects by the use of two-terminal, four-layer silicon PNPN semiconductor devices, also known as PNPN or "snap action" diodes. The PNPN diode operates in either of two stable states: a high impedance state of from 1 to 100 megohms or a low impedance state of less than 10 ohms, and is switched from one stable state to the other by virtue of the voltage and current supplied to it.

Figures 1, 3:
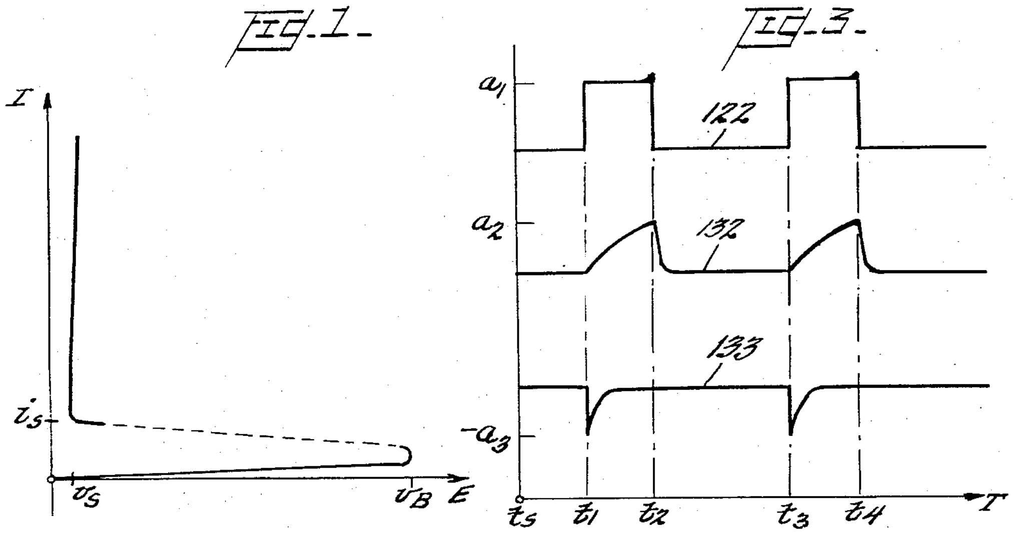
FIG. 1 is a graph of the voltage and current characteristics of a typical PNPN diode.
FIG. 3 is a graph of the wave forms obtained from the multivibrator depicted in FIG. 2.

Referring to FIG. 1, the shape of the voltage and current characteristics of a typical PNPN diode may be seen. Starting from the origin, an increase in the voltage across the diode in the forward direction will result in a gradual increase in the current through the device. The shallow slope of the curve indicates that the diode is in the high impedance state. When the voltage across the diode is further increased to the breakdown voltage, $v_b$, the diode suddenly shifts into the low impedance state and will remain in this state regardless of the voltage applied across it, provided that the current through the device exceeds the sustaining current $i_s$. At this sustaining current, there is a small sustaining voltage drop $v_s$ across the device. Typically, the breakdown voltage $v_b$ may be 40 volts, and the sustaining voltage $v_s$, 0.6 volt. The turn-on time may be less than 0.1 microsecond.

A more detailed description of the operation of the PNPN diode may be found in U.S. Patent 2,855,524, issued on Oct. 7, 1958, to W. Shockley, or in an article entitled "The Four-Layer Diode," by W. Shockley, in the August 1957 issue of Electronic Industries and Tele-Tech.

Figure 2:
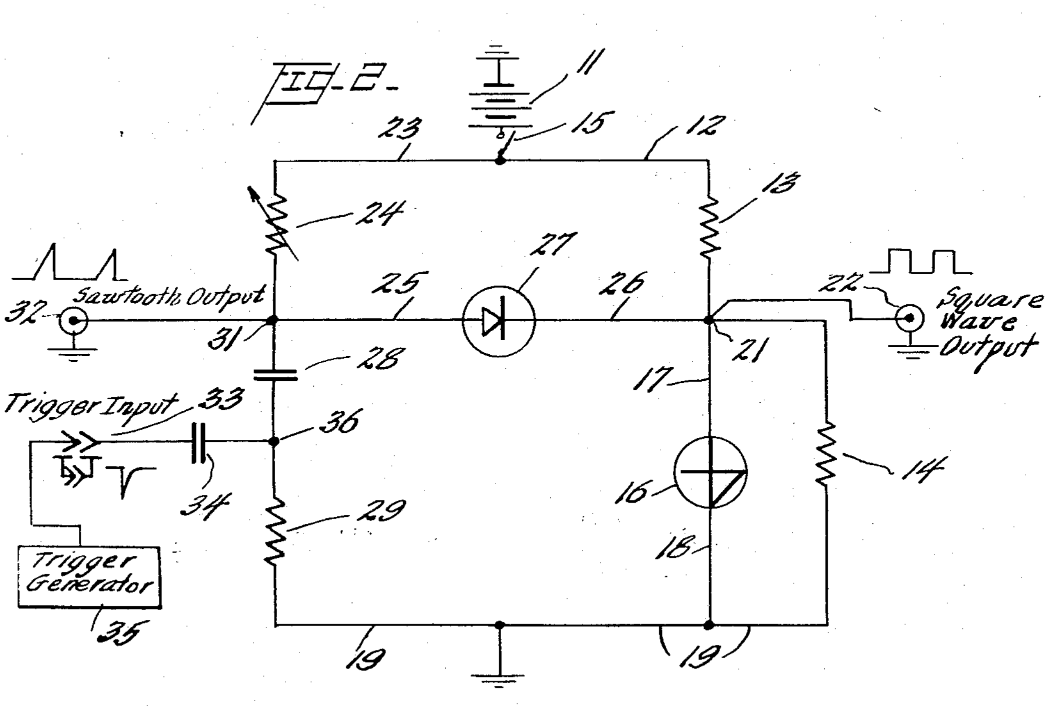
FIG. 2 is a circuit diagram of a monostable multivibrator in accordance with the principles of the present invention.

Referring now to FIG. 2, the circuit of a triggered, monostable multivibrator is illustrated wherein potential from a power supply 11 is connected through a switch 15 and a lead 12 to a voltage divider comprising a resistor 13 and a resistor 14 in series connected to a grounded lead 19. A PNPN diode 16, having an anode lead 17 and a cathode lead 18, is connected across the resistor 14 with the cathode lead 18 connected to the grounded lead 19, and the anode lead 17 connected to a juncture 21 of the resistors 13 and 14. The value of resistors 13 and 14 are chosen with respect to the power supply 11, so that the potential at the juncture 21 is less than the breakdown voltage $v_b$ of the PNPN diode 16.

A second path from the power supply 11 to the juncture 21 exists through a switch 15, a lead 23, a timing resistor 24, and an anode lead 25 and a cathode lead 26 of a conventional diode 27. A timing capacitor 28 and a trigger input resistor 29 in series connect a juncture 31 of the resistor 24 and the anode lead 25 to the grounded lead 19. A square wave output 22 is obtained from the juncture 21 and a sawtooth output 32 from the juncture 31. Trigger signals are fed into a trigger input 33 from a trigger generator 35 and pass through an isolation capacitor 34 to a juncture 36 of the timing capacitor 28 and the trigger input resistor 29.

In operation, switch 15 is closed to connect the potential of power supply 11 to leads 12 and 23. Immediately, the voltage at juncture 21 rises to a level $a_1$ (FIG. 3) determined by the ratio of resistors 13 and 14, but, as heretofore mentioned, this is less than the breakdown voltage $v_b$ of PNPN diode 16. If the circuit uses the previously discussed typical PNPN diode having a $v_b$ of 40 volts and a $v_s$ of 0.6 volt, then the potential of supply 11 may be 250 volts, resistor 11 may be 30,000 ohms, and resistor 14 may be 5,600 ohms or less, resulting in a potential at juncture 21 of 39.4 volts or less, which is less than the breakdown voltage $v_b$.

At the instant that switch 15 is closed, current starts to flow in the circuit branch comprising timing resistor 24, timing capacitor 28, and trigger input impedance resistor 29. The value of trigger input impedance 29 is normally negligibly small compared to the timing resistor 24. Typically, resistor 29 may be 50 ohms or greater and resistor 24 may be 30,000 ohms; thus the potential at juncture 36 is virtually ground potential. Initially the potential at juncture 31 is also at ground potential, as timing capacitor 28 is uncharged. However, as the charge builds up, the potential at juncture 31 rises exponentially towards the voltage of power supply 11. The rate at which the charge on capacitor 28 rises is a function of the RC product of timing resistor 24 and timing capacitor 28. Typically, timing capacitor 28 may have a value of 0.01 microfarad and the RC time constant may be 300 microseconds.

Initially, the fixed potential at juncture 21 is greater than the potential at juncture 31; hence, diode 27 is back-biased and no current flows therethrough. However, after the voltage at juncture 31 has risen to that of juncture 21, the diode 27 becomes forward-biased and shortly thereafter the potential across PNPN diode 16 exceeds the breakdown voltage $v_b$ and the device switches to its low impedance condition. The potential at juncture 21, and hence at output 22, falls almost instantaneously to the sustaining voltage $v_s$, which may typically be considered ground potential. Capacitor 28 now discharges to ground through conducting diode 27 and conducting PNPN diode 16. The potential at point 31 falls exponentially at a much faster rate than the charging rate, and a typical sawtooth wave is generated at output 32.

The circuit is now in its stable state and will remain in this condition until a momentarily negative-going trigger pulse is applied to the trigger input 33. This pulse is fed through the isolation capacitor 34 and the capacitor 28 to back-bias diode 27 and PNPN diode 16. The voltage across PNPN diode 16 now falls below the critical sustaining voltage $v_s$, and the diode 16 switches back to its high impedance condition. The magnitude of the negative trigger pulse must be sufficient to overcome the slight charge remaining in capacitor 28 and the forward voltage drops across conducting diodes 27 and 16. The duration of the trigger pulse need only be sufficient to back-bias diodes 27 and 16; typically, it may be one microsecond.

Once diode 27 is back-biased, the juncture 31 is no longer at effective ground potential and timing capacitor 28 recharges exponentially toward the potential of supply 11 to repeat the previously discussed cycle of operation. Thus, a square wave and a sawtooth wave are generated each time a trigger pulse is received by the circuit. The duration of the square wave and the sawtooth wave is dependent on the time necessary to raise the potential of juncture 31 sufficiently to forward bias diode 27. This in turn is a function of the RC product of capacitor 28 and resistor 24.

Resistor 24 may be made variable and a switched bank of decade capacitors substituted for fixed capacitor 28, if desired. This will allow a continuously variable range of pulse widths. It will be noted that the pulse amplitudes are dependent only on the ratio of resistors 13 and 14 and the potential of power supply 11, and are independent of the pulse widths. Experimental pulse widths of from 0.5 microsecond to more than 4 seconds have been obtained with this circuit. The square wave output at connector 22 is obtained directly across the PNPN diode 16 and as the PNPN diode has an extremely fast turn-on time, this output is virtually a perfect square wave.

Referring now to FIG. 3, there are shown the wave forms observed in the circuit of FIG. 2, after the circuit has reached a stable, steady state condition where $t=t_s$. The negative-going trigger input 133 is shown with peaks occurring at $t=t_1$ and $t=t_3$. When these peaks occur PNPN diode 16 is switched to a high impedance state, permitting a voltage $a_1$ to appear at the output 22 as shown in wave form 122. Simultaneously, capacitor 28 starts to charge exponentially through resistor 24, as shown in wave form 132. The maximum voltage level $a_2$ of wave 132 is substantially equal to the voltage $a_1$ of wave 122, and when wave 132 attains this maximum voltage at $t=t_2$ and $t=t_4$, the PNPN diode 16 returns to the low impedance state with the corresponding result that wave form 122 falls to substantially zero level as capacitor 28 rapidly discharges, as shown in wave form 132. The duration of the pulses $t_4-t_3$, and $t_2-t_1$, is, as previously discussed, a function of the RC time constant or resistor 24 and capacitor 28, and may be varied over a wide range. The amplitudes $a_1$ of wave form 122 and $a_2$ of wave form 132, are a function of resistors 13 and 14, and may be set to any suitable value, as PNPN diode 16 can be selected to have any breakdown voltage, $v_b$, that is necessary.

Figure 4:
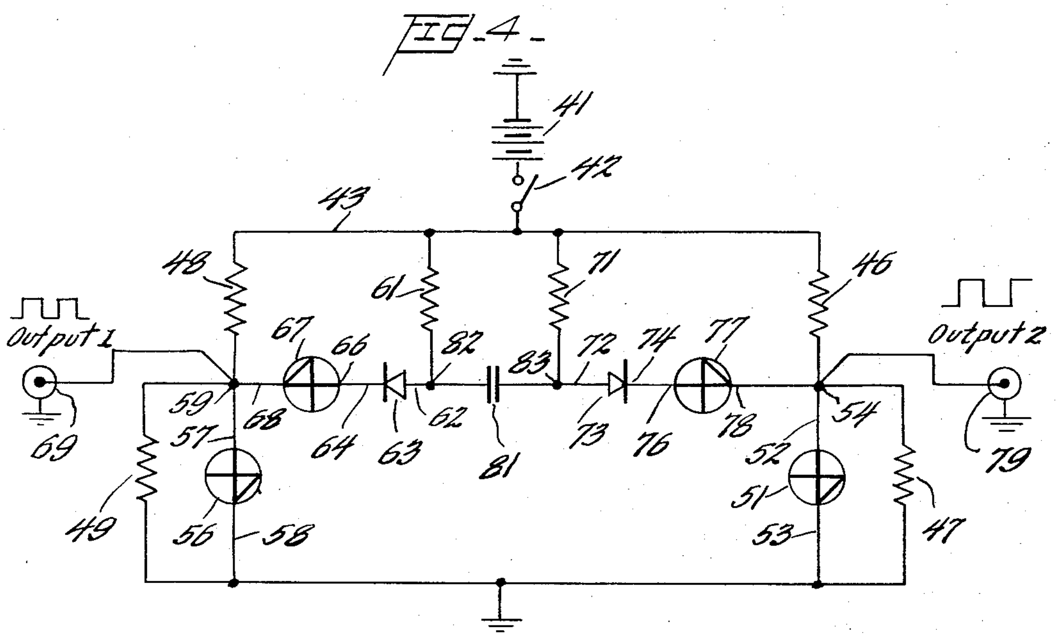
FIG. 4 is a circuit diagram of an astable multivibrator in accordance with the principles of the present invention.

Referring to FIG. 4, there is shown an alternative embodiment of the invention wherein two monostable multivibrators in accordance with the invention in FIG. 2 are coupled together to form a free-running astable multivibrator. In particular, a power supply 41 is connected through a switch 42 to a power bus 43. A pair of substantially identical voltage dividers are connected from the power bus 43 to a grounded bus 44. The first voltage divider comprises a resistor 46 in series with a resistor 47 and similarly, the second voltage divider comprises a resistor 48 and a resistor 49 in series. A PNPN diode 51, having an anode lead 52 and a cathode lead 53, is bridged across resistor 47 with the cathode lead 53 connected to the ground lead 44 and the anode lead 52 connected to a juncture 54 of the resistors 46 and 47.

Another PNPN diode 56, having an anode lead 57 and a cathode lead 58, is bridged across resistor 49 with the cathode lead 58 connected to the ground lead 44 and the anode lead 57 connected to a juncture 59 of resistors 48 and 49. The diodes 51 and 56 are selected so that their voltage and current characteristics are substantially identical. A timing resistor 61 is connected at one end to power bus 43 and to an anode lead 62 of a conventional diode 63 at the other end. A cathode lead 64 of the diode 63 is serially connected to an anode lead 66 of a PNPN diode 67. A cathode lead 68 of the PNPN diode 67 is connected to the juncture 59 to which is also connected a first output jack 69. Similarly, a timing resistor 71, equal in value to timing resistor 61, is connected at one end of power bus 43 and to an anode lead 72 of a conventional diode 73 at the other end. A cathode lead 74 of the diode 73 is serially connected to an anode lead 76 of a PNPN diode 77, having substantially equal characteristics to PNPN diode 67. A cathode lead 78 of PNPN diode 77 is connected to the juncture 54, to which is also connected a second output jack 79. A timing capacitor 81 is connected between a juncture 82 of the resistor 61 and the anode lead 62 and a juncture 83 of the resistor 71 and the anode lead 72.

In the circuit described above, the PNPN diodes 51 and 56 need not have the same characteristics as the PNPN diodes 67 and 77. The PNPN diodes 51 and 56 are the actual generators of the square wave pulses, whereas the PNPN diodes 67 and 71 and the conventional diodes 66 and 73 are used to prevent "freeze-up" of the circuit; that is, the simultaneous triggering of the PNPN diodes 51 and 56 into their high conductance state. Typically, the PNPN diodes 51 and 56 may have a breakdown voltage $v_b$ of 40 volts, and a sustaining voltage $v_s$ of 0.6 volt. The PNPN diodes 67 and 77, by way of contrast, may have a breakdown voltage $v_b$ of 27 volts and a sustaining voltage $v_s$ of 0.6 volt. Assuming the potential of power source 41 is 250 volts, then, typically, resistors 47 and 49 may be 5,600 ohms or less and resistors 46 and 48 may be 30,000 ohms. This results in a potential at junctures 54 and 59 of 39.4 volts or less, which is less than the breakdown voltage of PNPN diodes 51 and 56, as previously discussed.

In operation, the switch 42 is closed to connect potential from the power supply 41 to the power bus 43. Instantaneously, a potential appears at the junctures 54 and 59; however, as discussed for the circuit of FIG. 2, this potential is insufficient to cause the PNPN diodes 51 and 56 to switch to their low impedance condition. A second path exists between the power bus 43 and the juncture 54. This comprises the series connection of the resistor 71, the diode 73, and the PNPN diode 77. A similar path exists between the power bus 43 and the juncture 59; this comprises the resistor 61, the diode 63, and the PNPN diode 67.

The PNPN diodes 67 and 77 are selected to have substantially identical characteristics. However, as a practical matter, one or the other will have a slightly lower breakdown voltage. For the purposes of this description, assume that PNPN diode 67 has the lower breakdown voltage. Thus, a fraction of a microsecond after the switch 42 is closed, the PNPN diode 67 will switch to its low impedance state. This, in turn, raises the potential at juncture 59, and a fraction of a microsecond later, PNPN diode 56 also switches to its low impedance state. With the PNPN diodes 56 and 67 and the convention diode 63 all conducting, the junctures 59, 82, 83, and the output 69, are virtually at ground potential. Diode 73 and PNPN diode 77 are back-biased and cannot conduct. Thus the potential at the juncture 54 and the output 79 remains at a constant level, just below that required to switch the PNPN diode 51. As soon as PNPN diode 56 starts to conduct heavily, the capacitor 81 begins to charge, through the timing resistor 71, towards the potential of the supply 41. Thus, the potential at juncture 83 rises exponentially, and after an interval determined by the RC product of the resistor 71 and the capacitor 81, this potential reaches the level of the potential previously established at the juncture 54. The conventional diode 73 and the PNPN diode 77 now become forward-biased, but the PNPN diode remains in its high impedance state. After an additional time interval, the potential across the PNPN diode 77 reaches the breakdown voltage, and the PNPN diode 77 switches to its low impedance state. This rasises the potential at juncture 54, permitting, in turn, PNPN diode 51 to switch to its low impedance state. The junctures 54 and 83 and the output 79 now drop to virtually ground potential.

The potential at juncture 83 prior to the switching of PNPN diode 77 is plus $v_b$, the breakdown voltage of diode 77. Immediately after the switching of the diode 77, the potential is approximately ground potential. However, the charge of the capacitor 81 cannot change instantaneously. Therefore, the potential of the juncture 82, which was previously close to ground potential, drops suddenly to minus $v_b$. This large negative potential back-biases diode 63 and PNPN diodes 56 and 67 to return again to their high impedance states. The potential at output 69 returns to its former level, and the capacitor 81 now starts to charge from minus $v_b$ towards the potential of the supply 41 through timing resistor 61, not resistor 71, as previously. After a time interval determined by the RC product of the resistor 61 and the capacitor 81, the potential at the juncture 82 rises sufficiently to switch PNPN diode 67, which, in turn, switches PNPN diode 56 to repeat the cycle of operation.

The capacitor 81 is initially uncharged; thus, when the switch 42 is closed, the potential at juncture 83 need only rise from ground potential to $v_b$ in contrast to later cycles of operation when the potential at junctures 82 and 83 must rise from minus $v_b$ to plus $v_b$. Thus, the time duration of the first half-cycle of operation will be somewhat shorter than all subsequent half cycles; however, this is of no practical consequence. The duty cycle of the square waves obtained at outputs 69 and 79 is determined by the relative resistance of the resistors 61 and 71. If these are equal in value, the waves will be symmetrical. If one resistor is larger than the other, then the "on" period of one wave form will be greater than the "off" period and the converse will be true at the other output, since the two outputs are 180 degrees out of phase.

The frequency of operation is controlled by the two RC time constants of the capacitor 81 and the resistors 61 and 71. However, to avoid disturbing the symmetry of the generated wave forms, it is preferable to change the frequency of operation by making capacitor 81 variable or providing a switched bank of fixed capacitors plus a variable vernier capacitor. Typically, the resistor 61 and the resistor 71 may be 47,000 ohms and the capacitor 81 may be 0.1 microfarad. As in the circuit shown in FIG. 2, a very wide range of operating frequencies is possible with the circuit of this invention. Pulse widths of from one microsecond to more than two seconds have been obtained. The magnitudes $a_4$ and $a_5$ of the square waves at outputs 79 and 59, respectively, may be altered, independently, by making appropriate changes in the voltage dividers and the PNPN diodes 51 and 56. These magnitudes are completely unaffected by changes in the frequency of operation.

Figure 5:
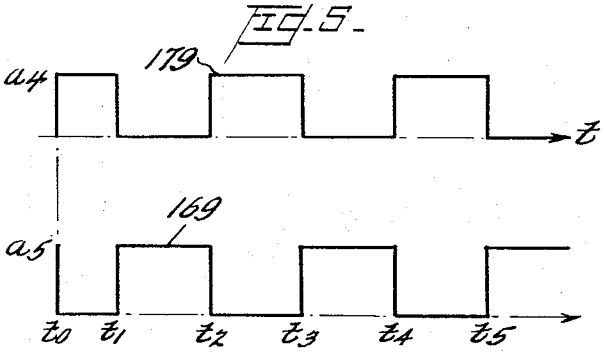
FIG. 5 is a graph of the wave forms obtained from the multivibrator depicted in FIG. 4.

Referring now to FIG. 5, there are shown the wave forms obtained from the embodiment of the invention described above and illustrated in FIG. 4. Wave form 169 is the signal obtained at output 69 and wave form 179 is the signal obtained at output 79. It will be clearly seen that the wave forms are 180 degrees out of phase, and that the potential at output 69 is zero when it is a maximum at output 79. The duration of the first half cycle of either wave, $t_1-t_0$, is seen to be slightly shorter than the second half cycle, $t_2-t_1$, and all subsequent half cycles.

It is believed that the operation of the above described circuits will be apparent from the foregoing description. While the apparatus has been described as being suitable for generating square waves and sawtooth waves, it will be obvious that various changes and modifications may be made therein without departing from the spirit and scope of the invention.

What is claimed is:

1. A square wave and sawtooth pulse generator, which comprises:
   - a source of power;
   - a purely resistive voltage-divider output circuit connected to said source of power;
   - a bistable semiconductive device having a high impedance state and a low impedance state bridged across a lower section of said voltage divider circuit;
   - a timing circuit having a first timing resistor, a timing capacitor, and a second timing resistor in series, connected to said source of power;
   - diode means for placing said first timing resistor in parallel with the upper section of said voltage divider to increase the current through said bistable device and switch said device to its low impedance state; and
   - trigger means, connected through said timing capacitor, for back-biasing said diode means to reswitch said bistable device back to its high impedance state and to divert the current through said first timing resistor into said timing capacitor.

2. In a monostable multivibrator, including a source of power;

a switching circuit connected to said source of power comprising the series combination of a first resistor, and a parallel subcombination of a second resistor and a PNPN diode;

a timing circuit connected to said source of power comprising, in series, a first timing resistor, a timing capacitor and a second timing resistor for charging said capacitor;

control means, connecting the juncture of said first timing resistor and said capacitor to the juncture of said first resistor and said parallel subcombination for initiating operation of said PNPN diode; and momentary trigger means connected to the juncture of said capacitor and said second timing resistor for inhibiting the operation of said control means whereupon said PNPN diode switches back to a high impedance condition.

3. A pulse generator comprising:

a bistable snap-action diode having a high conduction and a low conduction state;

a voltage divider means consisting of a pair of serially connected resistors and a power source;

means connecting the juncture of said resistors to bias said snap-action diode toward said high conduction state;

a control circuit including a resistor and a conducting diode interconnected between said power source and said junction for completing the biasing of said snap-action diode into said conduction state;

means for applying a negative trigger pulse to cut off said diode to place said snap-action diode in said nonconduction state; and a storage circuit connected to said control circuit and rendered effective after a delay for reoperating said diode to again bias said snap action diode into a state of conduction.

4. A pulse generator comprising:

a bistable semiconductor device having a low conductance state and a high conductance state, said device being switched to the high conductance state in response to a predetermined voltage and to the low conductance state when the current is reduced below a predetermined value;

resistance means connected to one side of said bistable device, said resistance means and said device defining a series current path;

a voltage divider connected in parallel with said series current path, said divider comprising a first resistor, a capacitor, and a second resistor connected in series, said first resistor running to said resistance means and said second resistor running to the other side of said bistable device;

a nonlinear device connected between the juncture of said first resistor and said capacitor and the juncture of said resistance means and said bistable device;

an output resistor connected in shunt with said bistable device to form a series-parallel combination with said resistance means;

means for applying a voltage across said voltage divider and series-parallel combination whereupon said serially connected resistance means supplies a current to the bistable device which is less than said predetermined value and said voltage divider applies a voltage to said nonlinear device which maintains the current through said bistable device above said predetermined value; and means connected to the juncture of said capacitor and said second resistor for applying a pulse to said voltage divider to back-bias said nonlinear device to trigger said bistable semiconductor device from a high conductance state to a low conductance state.

5. A pulse generator comprising:

a bistable semiconductor device having a low conductance state and a high conductance state, said device being switched to the high conductance state in response to a predetermined voltage and to the low conductance state when the current is reduced below a predetermined value;

a first resistor connected to one side of said bistable device, said resistor and said bistable device defining a series current path;

an output resistor connected in shunt with said bistable device to form a series-parallel combination with said first resistor;

a source of power connected across said series-parallel combination, said first resistor being selected with respect to said voltage to supply a current to the bistable device which is less than said predetermined value;

a control circuit running from said source of power to the juncture of said bistable device and said first resistor, said control circuit comprising a second resistor and a nonlinear device in series, to maintain the current through said bistable device above said predetermined value;

a timing circuit having a capacitor and a resistor in series, said capacitor being connected to the juncture of said second resistor and said nonlinear device, and said timing resistor being connected to the other side of said bistable device; and means, connected to the juncture of said timing capacitor and said timing resistor, for applying a momentary trigger pulse to back-bias said nonlinear device to switch said bistable device from a high conductance state to a low conductance state, whereupon said capacitor charges toward the voltage of said power supply to subsequently switch said bistable device back to a high conductance state.

6. An astable multivibrator having a broad range of operating frequency and including a source of power which comprises:

a first square wave generator connected to said source of power and including a first resistor, a conventional diode and a PNPN diode, and a bistable semiconductive switching device connected in series;

a second square wave generator connected to said source of power and including a second resistor, a conventional diode and a PNPN diode, and a bistable semiconductive switching device connected in series; and timing means, including said first and second resistors connected to said source of power, for alternately generating a first and second trigger potental through said first and second resistors to alternately operate said conventional and PNPN diodes to switch said second and first square wave generators.

7. A symmetrical astable multivibrator which comprises:

first and second voltage dividers each comprising a first and second current limiting resistor;

first and second bistable semiconductor devices connected in shunt across said second resistors, each bistable device having a low conductance state and a high conductance state, said devices being switched to the high conductance state in response to a predetermined voltage and to the low conductance state when the current therethrough is reduced below a predetermined value;

a voltage source connected across said first and second voltage dividers to supply a voltage to said first and second bistable devices which limits the current through said bistable devices below said predetermined value;

first and second control circuits running from said voltage source, each comprising a third resistor, a nonlinear device, and a control bistable device connected in series, running to the junctures of said first and second resistors, to increase the current through said first and second bistable devices above said predetermined value; and a capacitor interconnecting the junctures of said third resistors and said nonlinear devices to alternately back-bias said nonlinear devices to alternately switch said first and second bistable devices from a high conductance state to a low conductance state.

8. In a free-running multivibrator circuit having a pair of bistable stages connected to a common voltage source and wherein each stage includes:

a PNPN diode;

a series resistor circuit connected to said voltage source for biasing said diode toward conduction;

a normally unoperated control circuit including a timing resistor and diode for increasing the bias on said PNPN diode to render said PNPN diode conductive; and a common capacitor coupled between the junctions of said timing resistors and said control diodes in said pair of stages for accumulating a charge through a first of said biasing resistors to render conductive the control diode and the PNPN diode associated with said first biasing resistor whereupon the charging of the capacitor is switched to a circuit including the other timing resistor and the now conducting PNPN diode.

9. An astable multivibrator having first and second electrically symmetrical, bistable stages connected to a common source of power wherein each stage comprises:

a bistable, semiconductive device having a low impedance state and a high impedance state;

a voltage divider circuit connected to said source of power for biasing said device towards the low impedance state;

a normally unoperated control circuit including a timing resistor, and a conventional diode and a snap-action diode in series, for raising the bias on said device to change said device to the low impedance state; and a common timing capacitor coupled between the junctions of said timing resistors and said conventional diodes in said first and second stages for accumulating a charge through the timing resistor of the first stage to operate the control circuit and switch the bistable device into its low impedance state whereupon the capacitor commences to charge to the opposite polarity through the timing resistor associated with said second stage and the newly switched bistable device.

No references cited.

ARTHUR GAUSS, *Primary Examiner.*

J. A. JORDAN, *Assistant Examiner.*